(12) United States Patent
Aydonat et al.

(10) Patent No.: US 10,083,007 B2
(45) Date of Patent: Sep. 25, 2018

(54) FAST FILTERING

(71) Applicant: Altera Corporation, San Jose, CA (US)

(72) Inventors: Utku Aydonat, Toronto (CA); Andrew Chaang Ling, Toronto (CA); Gordon Raymond Chiu, North York (CA); Shane O'Connell, Etobicoke (CA)

(73) Assignee: ALTERA CORPORATION, San Jose, CA (US)

( * ) Notice: Subject to any disclaimer, the term of this patent is extended or adjusted under 35 U.S.C. 154(b) by 49 days.

(21) Appl. No.: 15/266,179

(22) Filed: Sep. 15, 2016

(65) Prior Publication Data
US 2018/0074787 A1 Mar. 15, 2018

(51) Int. Cl.
G06F 17/10 (2006.01)
G06F 7/44 (2006.01)
G06F 17/50 (2006.01)
G06F 17/30 (2006.01)

(52) U.S. Cl.
CPC .......... G06F 7/44 (2013.01); G06F 17/30946 (2013.01); G06F 17/5054 (2013.01)

(58) Field of Classification Search
None
See application file for complete search history.

(56) References Cited

U.S. PATENT DOCUMENTS

| 5,920,495 | A | * | 7/1999 | Hicok | G06T 5/20 |
| | | | | | 345/474 |
| 6,363,406 | B1 | * | 3/2002 | Takano | H03H 17/0266 |
| | | | | | 708/316 |
| 6,505,221 | B1 | * | 1/2003 | Maschmann | H03H 17/0219 |
| | | | | | 708/306 |
| 6,581,081 | B1 | * | 6/2003 | Messerly | G06F 17/148 |
| | | | | | 708/316 |
| 7,814,137 | B1 | | 10/2010 | Mauer | |
| 2001/0032226 | A1 | * | 10/2001 | Takano | H03H 17/02 |
| | | | | | 708/300 |
| 2007/0200738 | A1 | | 8/2007 | Reznik et al. | |
| 2008/0250092 | A1 | | 10/2008 | Montvelishsky | |
| 2010/0310007 | A1 | | 12/2010 | Lozhkin | |

FOREIGN PATENT DOCUMENTS

JP 2012-514909 A 6/2012

OTHER PUBLICATIONS

PCT International Search Report & Written Opinion for PCT Application No. PCT/US2017/050995 dated Dec. 20, 2017; 11 Pages.

* cited by examiner

Primary Examiner — David H Malzahn
(74) Attorney, Agent, or Firm — Fletcher Yoder, P.C.

(57) ABSTRACT

Devices and methods for filtering data include calculating intermediate input values from input elements using a transformation function. The transformation function is based at least in part on a size of the filter and a number of filter outputs. Intermediate filter values are calculated from filter elements of the filter using the transformation function. Each intermediate input value is multiplied with a respective intermediate filter value to form intermediate values. These intermediate values are combined with each other using the transformation function to determine one or more output values.

19 Claims, 6 Drawing Sheets

FAST FILTERING

BACKGROUND

The present disclosure relates generally to filtering using integrated circuits, such as field programmable gate arrays (FPGAs). More particularly, the present disclosure relates to Winograd-based filtering operations implemented for an integrated circuit (e.g., an FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. For instance, field programmable gate arrays (FPGAs) are integrated circuits that are intended as relatively general-purpose devices. FPGAs may include logic that may be programmed (e.g., configured) after manufacturing to provide any desired functionality that the FPGA is designed to support. Thus, FPGAs contain programmable logic, or logic blocks, that may be configured to perform a variety of functions on the FPGAs, according to a designer's design. For instance, FPGAs may be used to filter data. However, traditional filtering utilizes multiplication operations equal to a number of inputs times the number of filters for each calculated output. For example, filtering four inputs with three filter elements results in six multiplications for two outputs. Such multiplication operations contribute greatly to increased processing time thereby reducing efficiency of the filtering process.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for enhancing performance of machine-implemented programs using filtering circuitry. The filtering circuitry may implement a fast filtering approach that utilizes pre-processing to reduce a number of multiplication operations performed at runtime to increase filtering efficiency.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to circuitry for implementing fast filtering using a filtering technique that uses transformation functions to reduce a number of multiplication operations. For example, fast filtering may employ Winograd transformations to generate intermediate filtering results using pre-processing that are then multiplied together using less multiplication operations than used in a straightforward, naïve dot product of filter elements with input elements.

Fast filtering is a core operation in field-programmable gate array convolutional neural networks. Circuitry transforms filter and input data to intermediate filter and input data results using a transformation function. The transformation function may determine intermediate filter results based at least in part on a number of filter elements and output elements. For instance, the transformation function may include Winograd transformations. These intermediate filter and input data results are multiplied together using a dot-product (element-wise multiplication). A portion of these processes may be performed on-chip to keep bandwidth consumption low.

In some embodiments, circuitry may be dynamically configured. For example, intermediate-based filtering techniques may be bypassed to support basic dot-product operations. Moreover, different filter sizes and dimensions may be supported with different transformation functions but using the same general circuitry.

While the techniques of this disclosure are described chiefly in the context of reconfigurable devices, such as programmable logic devices with field programmable gate array (FPGA) fabric, this is meant to be illustrative and not limiting. Indeed, the filtering circuitry of this disclosure may be implemented in other integrated circuits. For example, other types of integrated circuits, such as applicant-specific integrated circuits (ASICs), microprocessors, memory devices, transceivers, and the like, may also use the fast filtering circuitry of this disclosure.

Figure 1:
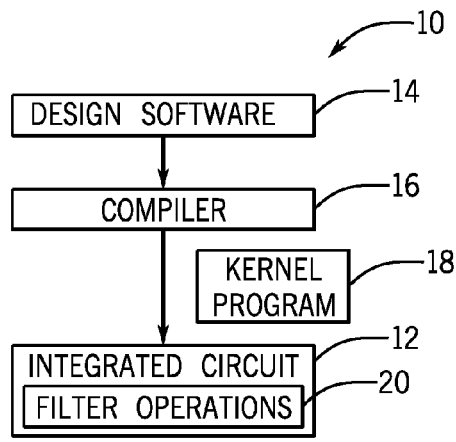
FIG. 1 is a block diagram of a system that utilizes fast filtering circuitry, in accordance with an embodiment.

With the foregoing in mind, FIG. 1 illustrates a block diagram of a system 10 that includes circuitry for filtering operations. As discussed above, a designer may implement functionality on an integrated circuit, such as a reconfigurable integrated circuit 12, such as a field programmable gate array (FPGA). The designer may implement a circuit design to be programmed onto the IC 12 using design software 14, such as a version of Quartus by Altera™. The design software 14 may use a compiler 16 to generate a low-level circuit-design kernel program 18, sometimes known as a program object file or bitstream, that programs the integrated circuit 12. That is, the compiler 16 may provide machine-readable instructions representative of the circuit design to the IC 12. For example, the IC 12 may receive one or more kernel programs 18 that describe the hardware implementations that should be stored in the IC. In some embodiments, filtering operations 20 may be implemented on the integrated circuit 12 using finite impulse response (FIR) filters, infinite impulse response (IIR) filters, linear filters, non-linear filters, time-variant filters, time-invariant filters, and/or other suitable filtering circuitry. As will be described in more detail below, direct application of a filter may include more multiplication operations at runtime than preprocessed filtering thereby increasing filtering latency.

Figure 2:
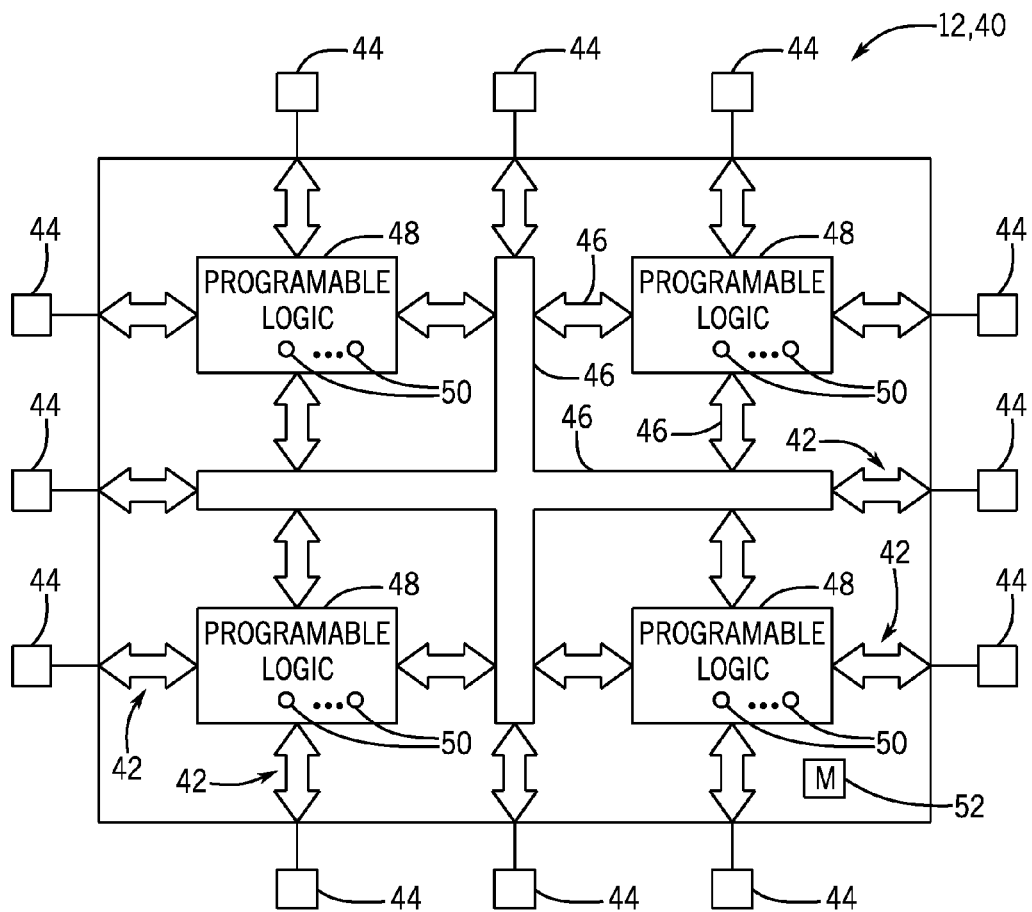
FIG. 2 is a block diagram of a programmable logic device that may include logic useful for implementing the fast filtering circuitry of FIG. 1, in accordance with an embodiment.

Turning now to a more detailed discussion of the IC 12, FIG. 2 illustrates an IC device 12, which may be a programmable logic device, such as a field programmable gate array (FPGA) 40. For the purposes of this example, the FPGA 40 is referred to as an FPGA, though it should be understood that the device may be any type of programmable logic device (e.g., an application-specific integrated circuit and/or application-specific standard product). As shown, FPGA 40 may have input/output circuitry 42 for driving signals off of FPGA 40 and for receiving signals from other devices via input/output pins 44. Interconnection resources 46, such as global and local vertical and horizontal conductive lines and buses, may be used to route signals on FPGA 40. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48. As discussed in further detail below, the FPGA 40 may include adaptable logic that enables partial reconfiguration of the FPGA 40, such that kernels may be added, removed, and/or swapped during the runtime of the FPGA 40.

Programmable logic devices, such as FPGA 40, may contain programmable elements 50 within the programmable logic 48. For example, as discussed above, a designer (e.g., a customer) may program (e.g., configure) the programmable logic 48 to perform one or more desired functions (e.g., filtering operations). By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may include one or more logic elements (wires, gates, registers, etc.). For example, during programming, configuration data is loaded into the memory 52 using pins 44 and input/output circuitry 42. In one embodiment, the memory 52 may be implemented as random-access-memory (RAM) cells. The use of memory 52 based on RAM technology is described herein is intended to be only one example. Moreover, memory 52 may be distributed (e.g., as RAM cells) throughout the FPGA 40. Further, because these RAM cells are loaded with configuration data during programming, they are sometimes referred to as configuration RAM cells (CRAM). The memory 52 may provide a corresponding static control output signal that controls the state of an associated logic component in programmable logic 48. For instance, in some embodiments, the output signals may be applied to the gates of metal-oxide-semiconductor (MOS) transistors within the programmable logic 48. In some embodiments, the programmable elements 50 may include DSP blocks that implement common operations, such as floating-point adder operations and/or filtering operations implemented using DSP blocks.

The circuitry of FPGA 40 may be organized using any suitable architecture. As an example, the logic of FPGA 40 may be organized in a series of rows and columns of larger programmable logic regions, each of which may contain multiple smaller logic regions. The logic resources of FPGA 40 may be interconnected by interconnection resources 46 such as associated vertical and horizontal conductors. For example, in some embodiments, these conductors may include global conductive lines that span substantially all of FPGA 40, fractional lines such as half-lines or quarter lines that span part of FPGA 40, staggered lines of a particular length (e.g., sufficient to interconnect several logic areas), smaller local lines, or any other suitable interconnection resource arrangement. Moreover, in further embodiments, the logic of FPGA 40 may be arranged in more levels or layers in which multiple large regions are interconnected to form still larger portions of logic. Still further, some device arrangements may use logic that is arranged in a manner other than rows and columns.

As discussed above, the FPGA 40 may allow a designer to create a customized design capable of executing and performing customized functionalities. Each design may have its own hardware implementation to be implemented on the FPGA 40. These hardware implementations may include floating-point operations and/or other operations using the DSP blocks programmable elements 50.

Figure 3:
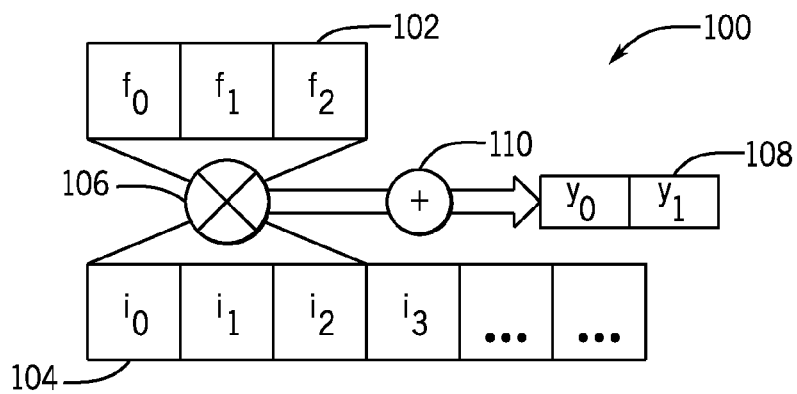
FIG. 3 is a block diagram of a filter using naive filtering, in accordance with an embodiment.

FIG. 3 illustrates a schematic diagram of a typical filtering circuitry 100. The filtering circuitry 100 is a 1×3 filter using three filter elements 102. The filter elements 102 are used to filter input data elements 104. Specifically, each filter element 102 is multiplied by a corresponding input data element 104 using a multiplier 106 with results for each output 108 added using reduction circuitry 110. Moreover, each output element 108 is a function of the number of filter elements 102 and inputs 104. For example, when the output elements 108 includes two elements the outputs may be determined using the following equations:

$$y_0 = i_0 f_0 + i_1 f_1 + i_2 f_2 \quad \text{(Equation 1)}$$

$$y_1 = i_1 f_0 + i_2 f_1 + i_3 f_2 \quad \text{(Equation 2)},$$

where $y_n$ is an indexed output elements 108, $i_n$ is the indexed input elements 104, and $f_n$ is the indexed filter elements 102. As previously noted, multiplication operations significantly contribute to filtering latency thereby reducing filtering efficiency. The approach of the filtering circuitry 100 arrives at a result with a number of multiplication operations that may be calculated using the follow equation:

$$n_{mult} = n_{f\_ele} * n_{outputs} \quad \text{(Equation 3)},$$

where $n_{mult}$ is the number of multiplication operations, of $n_{f\_ele}$ is the number of filter elements, and $n_{outputs}$ is the number of output elements.

Figure 4:
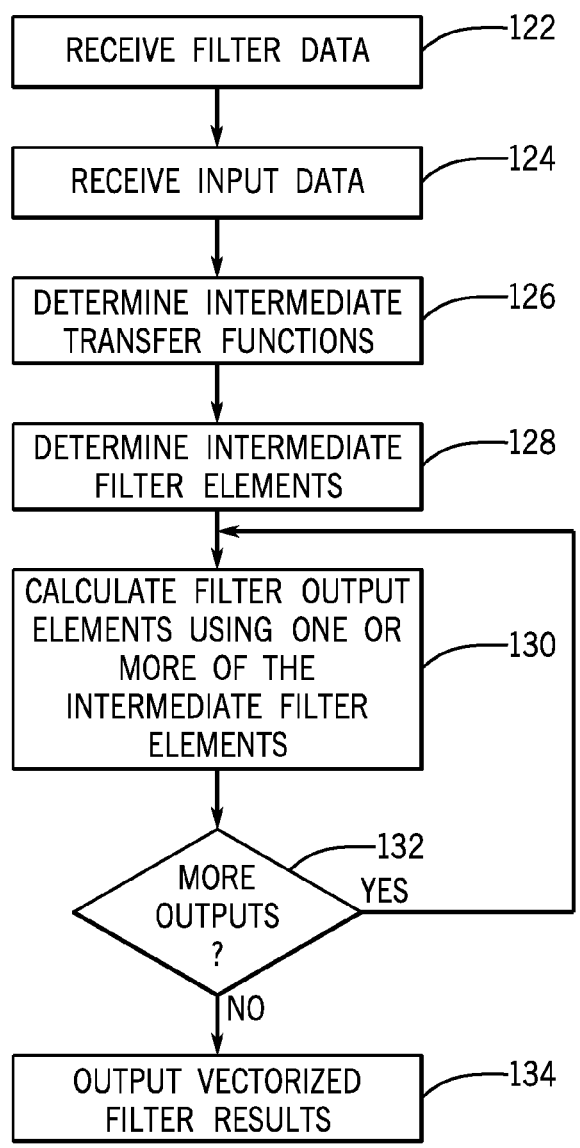
FIG. 4 is a flow diagram of a process for fast filtering using intermediate filter elements, in accordance with an embodiment.

Instead of naively multiplying filter elements by input elements, pre-processing and/or post-processing may be used to reduce the number of multiplication operations thereby increasing filter efficiency. FIG. 4 illustrates a process 120 for filtering data including receiving filter data at an integrated circuit (block 122). Receiving filtering data may include receiving filter elements and/or receiving an indication of a number of filter elements. The integrated circuit also receives input data (block 124). Receiving input data may include receiving input elements and/or receiving an indication of a number of input elements. Based on the number of filter data elements, the number of input data elements, and/or a number of output elements, a set of transformation functions is determined (block 126). The transformation function indicates how the input and filtering data are to be combined to form output data. The transformation functions may be stored in a lookup table (LUT) that stores sets of transformation functions according to number of input data elements, number of filter data elements, and/or number of output data elements. For example, Winograd fast filtering transformation equations may be stored in the LUT for number of input data elements, number of filter data elements, and/or number of output data elements. Additionally or alternatively, the transformation functions may be calculated using the number of input data elements, number of filter data elements, and/or number of output data elements after such numbers are received. For example, Winograd transformations may be calculated based on the number of input data elements, number of filter data elements, and/or number of output data elements.

Using the determined transformation equations, intermediate filter elements may be determined (block 128). Specifically, the intermediate filter elements are determined from values of filter elements used in the determined intermediate transfer functions. Using one or more of the intermediate filter elements, a filter output element may be calculated (block 130). If there are additional outputs (block 132), a filter output element for each output to be computed may be calculated. Once all of the outputs have been calculated, the output filter elements are output as vectorized filter results that have been transformed (block 134). In some embodiments, the vector may be a 1×1, 1×2, 1×3, 1×4, or a vector of longer length.

In some embodiments, at least a portion of the process 120 may be offloaded from an integrated circuitry chip to an off-chip processor (e.g., CPU of a host computer) that performs at least a portion of the process 120. For example, the transformation functions stored in the LUT may be functions previously calculated by a host computer. Moreover, the transformation functions may be at least partially passed to the integrated circuitry chip. For example, the intermediate filter elements may be pre-processed off of the chip.

Figure 5:
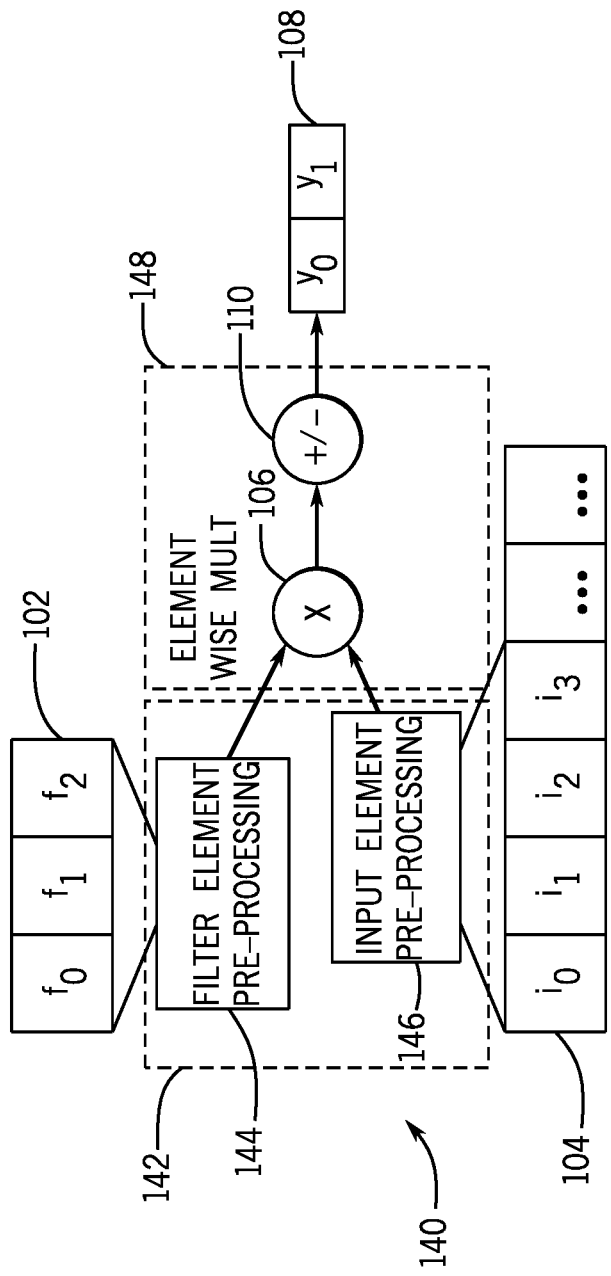
FIG. 5 is a block diagram illustrating a filter that may implement the process of FIG. 4, in accordance with an embodiment.

FIG. 5 illustrates a schematic view of filtering circuitry 140 that is similar to the filtering circuitry 100 including pre-processing elements 142. The pre-processing elements 142 may be implemented using software, hardware, or some combination thereof. The pre-processing elements 142 includes filter element pre-processing 144 and input element pre-processing 146. The filter element pre-processing 144 and the input element pre-processing 146 calculate or store intermediate elements based on a set or determined transformation function. For example, when there are three filter elements 102 and two output elements 108, the two output elements 108 may be calculated using the following equations:

$$y_0 = x_0 + x_1 + x_2 \quad \text{(Equation 4)}$$

$$y_1 = x_1 - x_2 - x_3 \quad \text{(Equation 5)},$$

where each $x_n$ is an intermediate value that may be calculated based on the input elements 104 and filter elements 102. For example, $x_0$–$x_3$ may be calculated from the following respective equations:

$$x_0 = (i_0 - i_2) * f_0 \quad \text{(Equation 6)}$$

$$x_1 = (i_1 + i_2) * (f_0 + f_1 + f_2)/2 \quad \text{(Equation 7)}$$

$$x_2 = (i_2 - i_1) * (f_0 - f_1 + f_2)/2 \quad \text{(Equation 8)}$$

$$x_3 = (i_1 - i_3) * f_2 \quad \text{(Equation 9)}$$

The filter portions of the equations may be loaded (e.g., pre-loaded) into the filter element pre-processing 144, and the input portions of the equations may be loaded into the input element pre-processing 146. These stored elements may then be multiplied together by multiplier 106 to create respective intermediate elements that are then added or subtracted (e.g., inverted and added) together using the reduction circuitry 110 to form the outputs 108. In some embodiments, at least some of the intermediate elements may be stored in memory (e.g., registers) for reuse. For example, in the illustrated embodiment, $x_1$ and $x_2$ may be stored in memory for reuse in calculating both outputs.

Note that the number of multiplications used in the filtering process using intermediate elements includes four multiplications rather than the previously discussed six multiplications used in a naive filtering approach providing a gain of 33% in multiplication operation reductions. Although some pre-processing and post-processing is deployed, the savings to multiplication operations is significant while pre-processing and post-processing may be offset by the amount of filtering latency efficiency increased due to less multiplication operations. Furthermore, the filtering process with intermediate elements may be extended to larger filters and/or multi-dimensional (e.g., 2D) filters to further reduce a number of multiplication operations. In some implementations, additional circuitry, such as registers, multiplexers, or clock pathing, may be used to manage timing of and/or retention of values in the described calculations.

Moreover, the pre-processing elements 142 may be implemented on-chip efficiently. Additionally or alternatively, the pre-processing elements 142 may be at least partially implemented off-chip to save resources. However, more data passed to the integrated circuit having filtering circuitry 140 consumes more bandwidth.

Additionally, processing circuitry 148 including the multiplier 106 and the reduction circuitry 110 may be configured to do a simple dot-product at runtime to increase flexibility without reducing efficiency of simple dot-product operations through the circuitry. For example, multiplexers, as discussed below, may be used to bypass the pre-processing elements 142 to produce only a simple cross-product without filtering.

Figure 6:
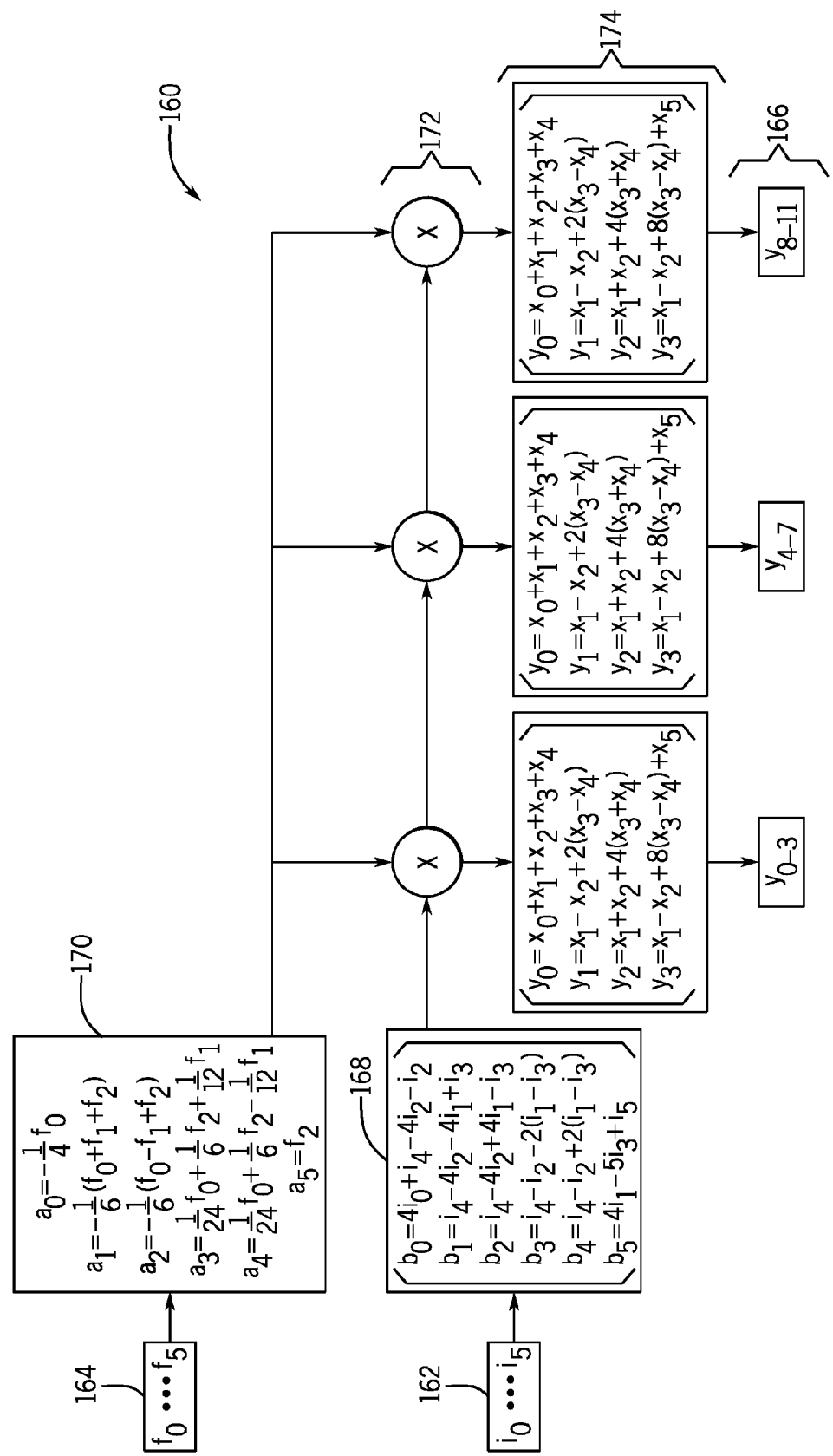
FIG. 6 is a schematic diagram illustrating filter circuitry that may implement the process of FIG. 4 including processing blocks, in accordance with an embodiment.

FIG. 6 illustrates an embodiment of filtering circuitry 160 that filters input six input elements 162 using six filter elements 164 to produce an output 166. The output 166 is a vectorized output. The input elements 162 are submitted to input element pre-processing circuitry 168 to produce intermediate input elements. Similarly, the filter elements 164 are submitted to filter element pre-processing circuitry 170 to produce intermediate filter elements. The intermediate input elements are each multiplied by a respective intermediate filter element using multipliers 172 to produce intermediate elements. The intermediate elements are post processed in the post-processing 174 to achieve the vectorized outputs.

Figure 7:
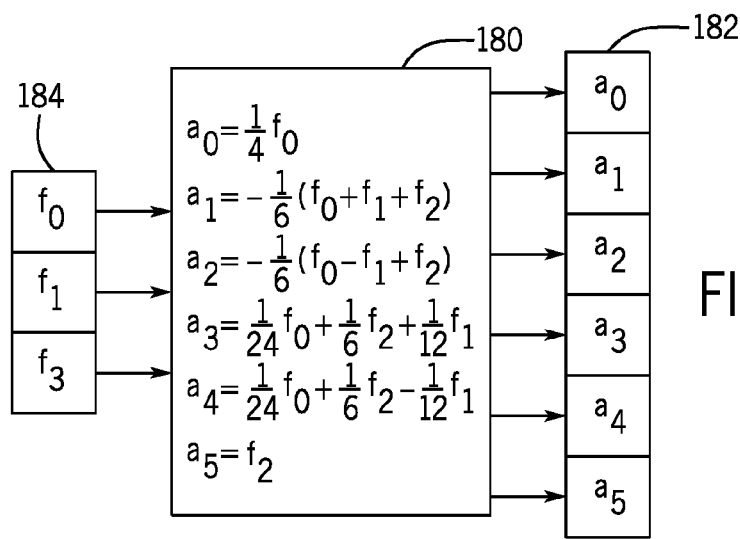
FIG. 7 is a block diagram of a processing block that derives filter intermediate elements from filter elements, in accordance with an embodiment.
Figure 8:
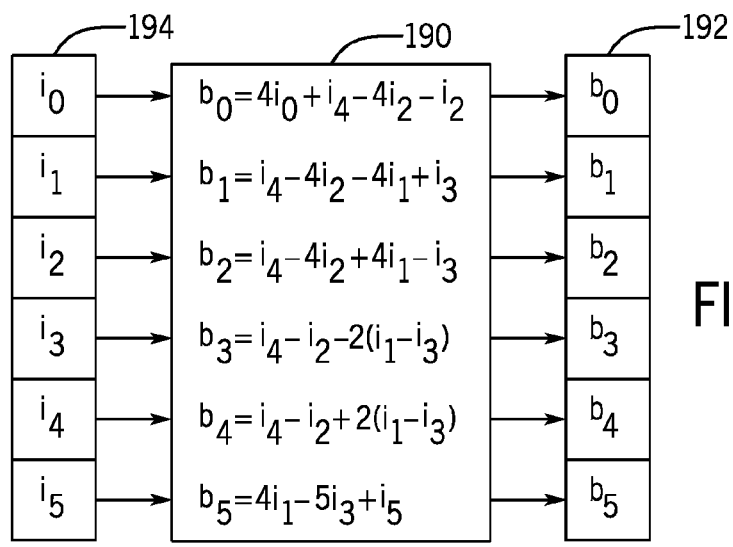
FIG. 8 is a block diagram of a processing block that generates intermediate input values from input values using the transformation function, in accordance with an embodiment.
Figure 9:
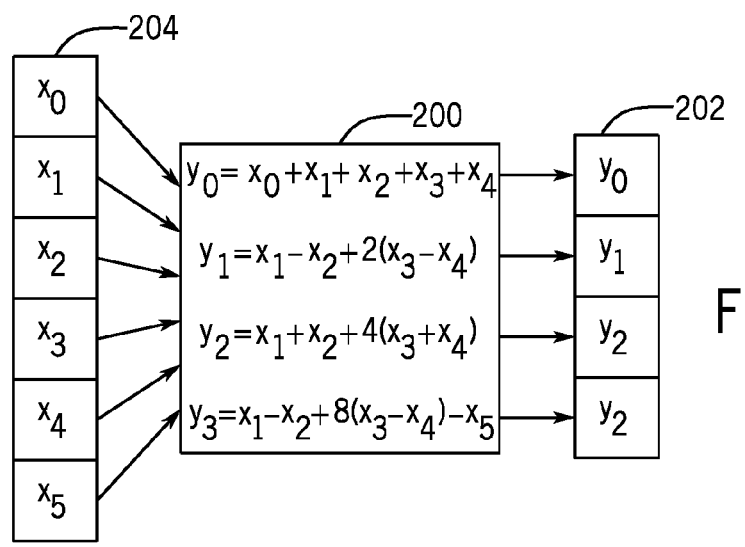
FIG. 9 is a block diagram of a processing block that generates an output from intermediate values using an output transformation function, in accordance with an embodiment.

FIG. 7 illustrates an embodiment of transformation circuitry 180 that may be used to derive filter intermediate elements 182 from filter elements 184. The illustrated embodiment includes transformations corresponding to a 1×3 filter with four outputs (e.g., F(4,3) filter). However, such transformation circuitry 180 may be applied to any number of filter elements and outputs. Indeed, such transformations may be also conducted on multi-dimensional filters with different transformation functions. In some embodiments, the transformation circuitry 180 may be implemented on-die for the integrated circuit 12. Additionally or alternatively, at least a portion of the transformation may be pre-calculated off-die. For example, the transformation algorithms used by the transformation circuitry 180 may be set in the transformation circuitry 180 using a host computer. In some embodiments, the transformation circuitry 180 may be implemented in a programmable logic. FIG. 8 illustrates an embodiment of transformation circuitry 190, similar to the transformation circuitry 180, that may be used to derive input intermediate elements 192 from input elements 194. FIG. 9 illustrates an embodiment of post-processing circuitry 200, similar to the transformation circuitry 180, that may be used to derive output elements 202 from intermediate output elements 204. The intermediate output elements 204 may each be calculated from a multiplication of a respective intermediate filter element 182 with a respective intermediate input element 192.

Figure 10:
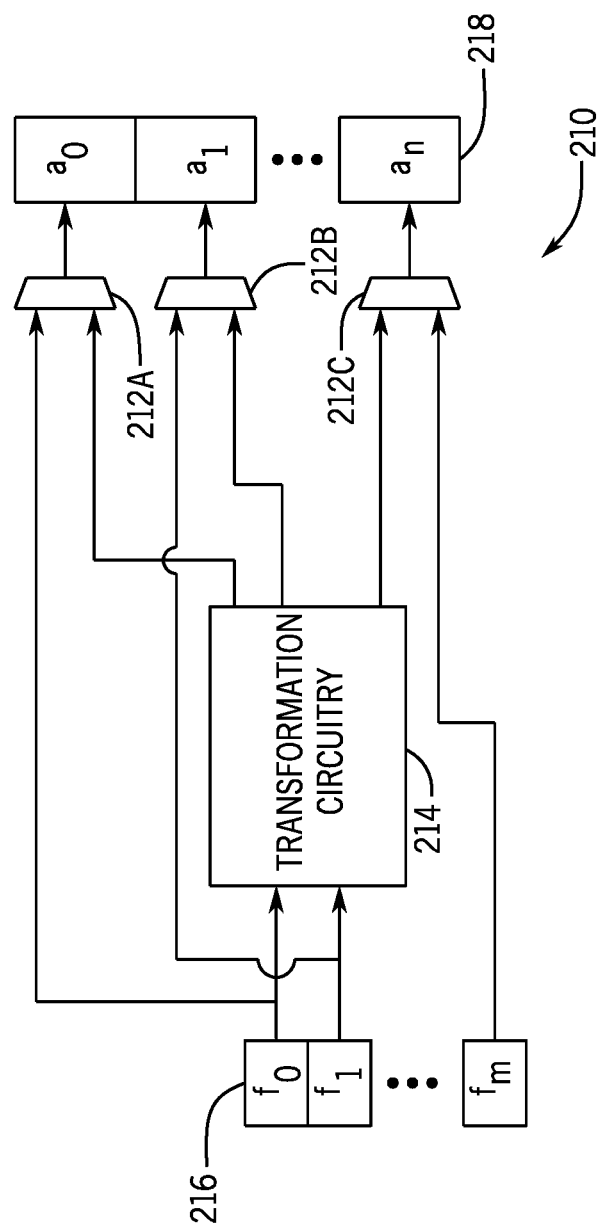
FIG. 10 illustrates bypass circuitry that enables bypassing processing blocks to enable simple cross products, in accordance with an embodiment.

As previously discussed, the transformation circuitry 180, 190, and/or 200 may be bypassed when filtering is not to be used. FIG. 10 illustrates an embodiment of a filtering system 210 with bypass multiplexers 212A that enable bypassing of transformation circuitry 214 causing output values 218 (e.g., intermediate filter values) to be the same as some input value 216 (e.g., filter values). The illustrated embodiment pertains to filter values, but similar techniques may be applied to input elements and output elements. These bypasses allow use of filtering without intermediate filter techniques (e.g., Winograd transforms) and/or simple cross-products.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A method for filtering input elements using a filter, comprising:
    calculating, using an input processing circuitry to calculate, intermediate input values from the input elements using a transformation function, wherein the transformation function is based at least in part on a size of the filter and a number of filter outputs;
    calculating, using a filter processing circuitry, intermediate filter values from filter elements of the filter using the transformation function;
    multiplying, using multiplier circuitry, each intermediate input value with a respective intermediate filter value to form intermediate values;
    combining the intermediate values with each other using the transformation function to determine one or more output values; and
    outputting the one or more output values.

2. The method of claim 1, wherein combining the intermediate values is performed on a programmable device.

3. The method of claim 1, wherein combining the intermediate values is performed on a field-programmable gate array.

4. The method of claim 1, comprising calculating the transformation function based at least in part on a size of the filter and a number of filter outputs.

5. The method claim 1, wherein the transformation function is calculated using a host computer.

6. The method of claim 5, comprising storing the transformation function in memory of an integrated circuit device from the host computer.

7. An integrated circuit device comprising:
    an input node that receives one or more input elements;
    filtering circuitry that receives the one or more input elements and receives one or more filter elements, wherein the filtering circuitry comprises:
        filter processing circuitry that calculates intermediate filter values using a transformation function that is based at least in part on a number of outputs; and
        multiplier circuitry that combines the intermediate filter values with intermediate input values to form output values that reflect a result that would result from a direct element-based multiplication of the one or more input elements by the one or more filter elements, using a number of multiplications equal to a number of the one or more elements minus one, but with fewer multiply operations than the direct element-based multiplication.

8. The integrated circuit device of claim 7, wherein the filtering circuitry comprises an input element processing circuitry that receives the one or more input elements and transforms the one or more input elements to corresponding intermediate input elements using the transformation function.

9. The integrated circuit device of claim 8, wherein a number of elements in the one or more input elements is different than a number of elements in the intermediate input elements.

10. The integrated circuit device of claim 8, comprising a multiplexer coupled to the input node and the input element processing circuitry to select an unchanged version of the one or more input elements from the input node as a bypass of the input element processing circuitry or select an output of the input element processing circuitry.

11. The integrated circuit device of claim 8, wherein the filtering circuitry comprises a filter element processing circuitry that receives the one or more filter elements and transforms the one or more filter elements to corresponding intermediate filter elements using the transformation function.

12. The integrated circuit device of claim 11, wherein the filtering circuitry comprises a multiplexer that enables bypass of the filter element processing circuitry.

13. The integrated circuit device of claim 11, wherein the filtering circuitry comprises a multiplier that multiplies the intermediate input elements by the intermediate filter elements in an element-wise multiplication to form the intermediate filter values.

14. The integrated circuit device of claim 13, wherein the filtering circuitry comprises reduction circuitry that combines the combined intermediate filter values from the multiplier circuitry together by adding together or subtracting each intermediate filter values from each other.

15. The integrated circuit device of claim 8, wherein the integrated circuit device comprises a field-programmable gate array.

16. A programmable logic device comprising:
input circuitry that receives a plurality of input elements;
filter circuitry that receives a plurality of filter elements;
an input processing circuitry transforms the plurality of input elements to a plurality of intermediate input elements using a transformation function based at least in part on filter size and a number of output elements;
a filter processing circuitry transforms the plurality of filter elements to a plurality of intermediate filter elements using a transformation function based at least in part on the filter size and the number of output elements; and
multiplier circuitry configured to multiply the plurality of intermediate input elements with the plurality of intermediate filter elements using a dot product of the plurality of intermediate input elements with the plurality of intermediate filter elements.

17. The programmable logic device of claim 16, wherein the input processing circuitry is implemented in a programmable logic fabric of the programmable logic device.

18. The programmable logic device of claim 16, wherein the filter processing circuitry is implemented in a programmable logic fabric of the programmable logic device.

19. The programmable logic device of claim 16, wherein the programmable logic device comprises a field-programmable gate array.

* * * * *